US011837565B2

United States Patent
Kaleem et al.

(10) Patent No.: US 11,837,565 B2
(45) Date of Patent: Dec. 5, 2023

(54) DEVICES INCLUDING COAX-LIKE ELECTRICAL CONNECTIONS AND METHODS FOR MANUFACTURING THEREOF

(71) Applicant: Infineon Technologies AG, Neubiberg (DE)

(72) Inventors: Saqib Kaleem, Munich (DE); Jonas Eric Sebastian Fritzin, Munich (DE); Martin Dechant, Graz (AT); Pietro Brenner, Ebersberg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/443,204

(22) Filed: Jul. 22, 2021

(65) Prior Publication Data

US 2022/0059487 A1 Feb. 24, 2022

(30) Foreign Application Priority Data

Aug. 24, 2020 (DE) .......................... 102020122073.1

(51) Int. Cl.
*H01L 23/00* (2006.01)
*H01L 23/66* (2006.01)
*H01L 23/498* (2006.01)

(52) U.S. Cl.
CPC ........ *H01L 24/14* (2013.01); *H01L 23/49838* (2013.01); *H01L 23/66* (2013.01); *H01L 24/02* (2013.01); *H01L 24/13* (2013.01); *H01L 24/16* (2013.01); *H01L 2223/6627* (2013.01); *H01L 2224/0235* (2013.01); *H01L 2224/02375* (2013.01); *H01L 2224/02379* (2013.01); *H01L 2224/02381* (2013.01); *H01L 2224/13024* (2013.01); *H01L 2224/1411* (2013.01);
(Continued)

(58) Field of Classification Search
CPC ....................................... H01L 24/14
See application file for complete search history.

(56) References Cited

U.S. PATENT DOCUMENTS 10,937,748 B1 * 3/2021 Kanj ................. H01L 24/09
11,304,298 B2 * 4/2022 LeClair ................. H05K 1/115
(Continued)

FOREIGN PATENT DOCUMENTS

| DE | 11 2016 000 846 T5 | 11/2017 |
|---|---|---|
| JP | 4-340732 A | 11/1992 |
| JP | 10-178144 A | 6/1998 |

*Primary Examiner* — William A Harriston
(74) *Attorney, Agent, or Firm* — Harrity & Harrity, LLP

(57) ABSTRACT

A device includes a semiconductor chip including an electrical contact arranged on a main surface of the semiconductor chip. The device includes an external connection element configured to provide a first coax-like electrical connection between the device and a printed circuit board, wherein the first coax-like electrical connection includes a section extending in a direction vertical to the main surface of the semiconductor chip. The device further includes an electrical redistribution layer arranged over the main surface of the semiconductor chip and configured to provide a second coax-like electrical connection between the electrical contact of the semiconductor chip and the external connection element, wherein the second coax-like electrical connection includes a section extending in a direction parallel to the main surface of the semiconductor chip.

22 Claims, 6 Drawing Sheets

(52) U.S. Cl.
CPC ............... *H01L 2224/14131* (2013.01); *H01L 2224/14141* (2013.01); *H01L 2224/16225* (2013.01)

(56) References Cited

U.S. PATENT DOCUMENTS

| | | |
|---|---|---|
| 2002/0166689 A1 | 11/2002 | Maetani |
| 2006/0226928 A1 | 10/2006 | Henning et al. |
| 2009/0072398 A1 | 3/2009 | Irsigler et al. |
| 2015/0028470 A1* | 1/2015 | Gallegos ............ H01L 21/76898 257/737 |
| 2015/0035615 A1* | 2/2015 | Boone ..................... H01P 5/085 333/260 |
| 2016/0249448 A1* | 8/2016 | Shiozaki ................. H05K 1/025 |
| 2016/0276727 A1* | 9/2016 | Dang ...................... H01Q 1/50 |
| 2018/0205134 A1* | 7/2018 | Khan ....................... H01Q 5/314 |
| 2019/0348379 A1* | 11/2019 | Kuo ........................ H01L 23/66 |
| 2019/0393172 A1* | 12/2019 | Pietambaram .......... H01L 24/19 |
| 2020/0118951 A1* | 4/2020 | Aleksov .............. H01L 21/4857 |
| 2020/0211949 A1* | 7/2020 | Strong ................. H01L 21/561 |
| 2020/0294901 A1* | 9/2020 | Strong ................ H01L 25/0655 |
| 2020/0294940 A1* | 9/2020 | Dogiamis ............... H01P 3/122 |

* cited by examiner

DEVICES INCLUDING COAX-LIKE ELECTRICAL CONNECTIONS AND METHODS FOR MANUFACTURING THEREOF

CROSS REFERENCE TO RELATED APPLICATION

This application claims priority to German Patent Application No. 102020122073.1, filed on Aug. 24, 2020, the contents of which are incorporated by reference herein in their entirety.

TECHNICAL FIELD

The present disclosure relates to devices including coax-like electrical connections. In addition, the present disclosure relates to methods for manufacturing such devices.

BACKGROUND

Radio-based communication devices, such as MIMO (Multiple-Input Multiple-Output) systems, typically include multiple channels to transmit and receive radio signals. During operation of such devices undesired crosstalk resulting from electromagnetic interferences may occur between adjacent communication channels

SUMMARY

An aspect of the present disclosure relates to a device. The device comprises a semiconductor chip comprising an electrical contact arranged on a main surface of the semiconductor chip. The device further comprises an external connection element configured to provide a first coax-like electrical connection between the device and a printed circuit board, wherein the first coax-like electrical connection comprises a section extending in a direction vertical to the main surface of the semiconductor chip. The device further comprises an electrical redistribution layer arranged over the main surface of the semiconductor chip and configured to provide a second coax-like electrical connection between the electrical contact of the semiconductor chip and the external connection element, wherein the second coax-like electrical connection comprises a section extending in a direction parallel to the main surface of the semiconductor chip.

An aspect of the present disclosure relates to a method for manufacturing a device. The method comprises generating a semiconductor chip comprising an electrical contact arranged on a main surface of the semiconductor chip. The method further comprises fabricating an external connection element configured to provide a first coax-like electrical connection between the device and a printed circuit board, wherein the first coax-like electrical connection comprises a section extending in a direction vertical to the main surface of the semiconductor chip. The method further comprises fabricating an electrical redistribution layer arranged over the main surface of the semiconductor chip and configured to provide a second coax-like electrical connection between the electrical contact of the semiconductor chip and the external connection element, wherein the second coax-like electrical connection comprises a section extending in a direction parallel to the main surface of the semiconductor chip.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

Figure 1:
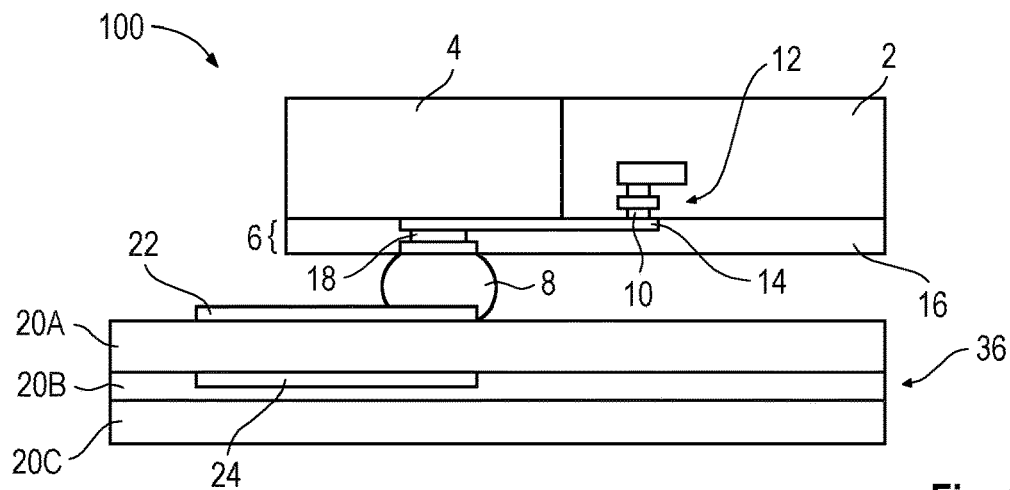
FIG. 1 schematically illustrates a cross-sectional side view of a device including a coax-like electrical connection in accordance with the disclosure.

The device 100 of FIG. 1 may include a semiconductor chip (which may also be referred to as a semiconductor die) 2 embedded in an encapsulation material 4. An electrical redistribution layer 6 may be arranged over the semiconductor chip 2 and over the encapsulation material 4. One or more external connection elements 8 may provide a mechanical (or galvanic) connection and an electrical connection between the device 100 and a printed circuit board 36. The printed circuit board 36 may be seen as a part of the device 100 or not.

The semiconductor chip 2 (or electronic circuits of the semiconductor chip 2) may operate in a frequency range of higher than about 1 GHz, in some implementations higher than 10 GHz. The semiconductor chip 2 may thus also be referred to as an RF ("radio frequency") chip or an HF ("high frequency") chip. In some implementations, the semiconductor chip 2 may operate in a high frequency range or microwave frequency range, which may range from about 10 GHz to about 300 GHz. Microwave circuits may include, for example, microwave transmitters, microwave receivers, microwave transceivers, microwave sensors, microwave detectors, and/or the like. Devices in accordance with the disclosure may be used for radar applications in which the frequency of the RF signals may be modulated. Accordingly, the semiconductor chip 2 may correspond to a radar chip. Radar microwave devices may be used, for example, in automotive or industrial applications for range and speed measuring systems. By way of example, automatic vehicle cruise control systems or vehicle anti-collision systems may operate in the microwave frequency range, for example in the 24 GHz, 76 GHz, or 79 GHz frequency bands.

The semiconductor chip 2 may include one or more electrical contacts 10 that may be arranged on a main surface of the semiconductor chip 2. For example, an electrical contact 10 may be formed by a bond pad which may be made of aluminum. In addition, an internal electrical wiring 12 arranged inside of the semiconductor chip 2 may be electrically connected to the electrical contact 10. Electrical circuits (not illustrated) of the semiconductor chip 2 may be electrically accessible via the electrical contact 10 and the internal electrical wiring 12.

The semiconductor chip 2 may be at least partly embedded in the encapsulation material 4. In some implementations, as shown in FIG. 1, the encapsulation material 4 may cover one or more side surfaces of the semiconductor chip 2. In some implementations, the encapsulation material 4 may also cover the upper main surface of the semiconductor chip 2. The lower main surface of the semiconductor chip 2 may be uncovered by the encapsulation material 4. In some implementations, the lower main surface of the encapsulation material 4 and the lower main surface of the semiconductor chip 2 may be arranged in a common plane. The encapsulation material 4 may form a housing (or package) of the semiconductor chip 2 such that the device 100 may also be referred to as a semiconductor package. In some implementations, the encapsulation material 4 may include at least one of the following materials: an epoxy, a filled epoxy, a glass fiber filled epoxy, an imide, a thermoplast, a thermoset polymer, and/or a polymer blend. In some implementations, the encapsulation material 4 may be formed from a mold compound.

The electrical redistribution layer 6 may have one or more electrically conductive structures 14 in the form of metal layers (or metal tracks), which may run substantially parallel to the main surfaces of the semiconductor chip 2 and the encapsulation material 4. In some implementations, the metal layers 14 may be made of copper or a copper alloy. One or more dielectric layers 16 may be arranged between the metal layers 14 to electrically isolate the metal layers 14 from each other. For example, the dielectric layers 16 may be made of at least one of an oxide or a nitride. Furthermore, metal layers 14 arranged on different vertical levels can be electrically connected to each other by one or more via connections 18. The internal electrical wiring 12 and/or the electrical redistribution layer 6 may be referred to as first level interconnect of the device 100.

The electrical redistribution layer 6 may at least partly extend over the lower main surface of the encapsulation material 4. Accordingly, at least one of the external connection elements 8 may be arranged lateral of the semiconductor chip 2. In such case, the device 100 may be referred to as fan-out device or fan-out package. In some implementations, as shown in FIG. 1, the device 100 may correspond to a wafer level package, which may be manufactured by an eWLB (embedded Wafer Level Ball Grid Array) process.

The device 100 may be mounted on the printed circuit board 36 using the external connection element 8. Electronic structures of the semiconductor chip 2 may be electrically accessible from outside of the semiconductor package via the external connection element 8. For example, an external electrical connection element 8 may provide electrical access to a transmit (TX) channel or a receive (RX) channel of the semiconductor chip 2. In some implementations, as shown in FIG. 1, the external connection element 8 may include one 3D-conductor structure in form of a solder ball or a solder pillar. In some implementations, as described elsewhere herein, the external connection element 8 may include multiple conductor structures which may be configured to provide a coax-like (or coaxial-like) electrical connection. Note that herein the terms "coax-like" and "coaxial-like" may be interchangeably used. The external connection element 8 may form the second level interconnect of the device 100.

The printed circuit board 36 may be formed by multiple layers stacked over each other. In some implementations, as shown in FIG. 1, the printed circuit board 36 may include three stacked layers 20A, 20B and 20C which may be made of or may include a high frequency laminate material (layer 20A), a prepreg material (layer 20B) (e.g., pre-impregnated fiber), and an FR4 material (layer 20C). In some implementations, the printed circuit board 36 may include electrically conductive structures 22 arranged on the top surface and/or on the bottom surface as well as electrically conductive structures 24 arranged inside of the printed circuit board 36, as described in greater detail below.

Figure 2:
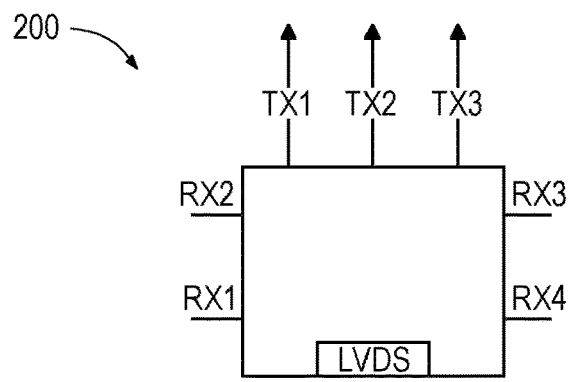
FIG. 2 schematically illustrates a top view of a device including a coax-like electrical connection in accordance with the disclosure.

The device 200 of FIG. 2 may include some or all of the features of the device 100 of FIG. 1. In some implementations, as shown in FIG. 2, the device 200 may include three transmit (TX) channels TX1 to TX3 that may be arranged at the upper edge of the device 200. In some implementations, the device 200 may include two receive (RX) channels RX1, RX2 that may be arranged at the left edge of the device 200 and two receive (RX) channels RX3, RX4 arranged at the right edge of the device 200. It is understood that other devices in accordance with the disclosure may include an arbitrary different numbers of TX channels and/or RX channels.

Figure 3:
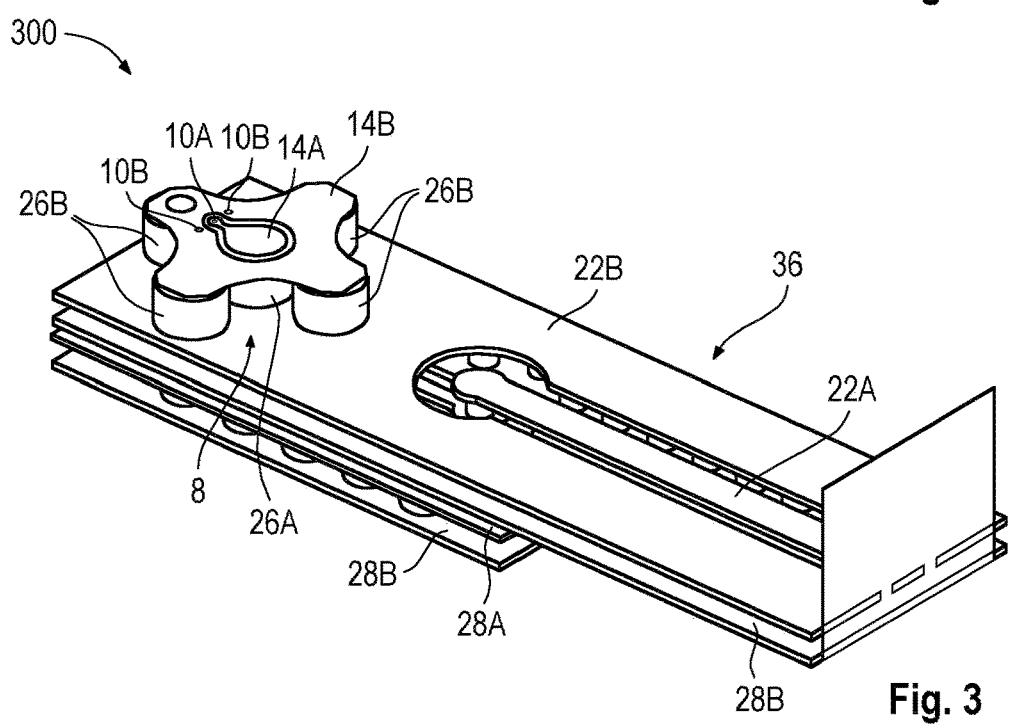
FIG. 3 schematically illustrates a perspective view of a portion of a device including a coax-like electrical connection in accordance with the disclosure.

FIG. 3 schematically illustrates a perspective view of a portion of a device 300 in accordance with the disclosure. The device 300 may include some or all of the features of the devices 100 and 200 of FIGS. 1 and 2. For the sake of simplicity, a semiconductor chip and dielectric layers of a redistribution layer of the device 300 are not shown in FIG. 3.

The device 300 may include multiple electrical contacts 10A and 10B of a semiconductor chip (not illustrated). In some implementations, as shown in FIG. 3, a first electrical contact 10A may be configured to carry electrical signals from and/or to electronic circuits of the semiconductor chip. Two further electrical contacts 10B may be connected to a ground potential or return path. The device 300 may further include an electrical redistribution layer of which electrically conductive structures 14A and 14B are shown in the implementation depicted in FIG. 3. Dielectric layers and via connections of the electrical redistribution layer are not illustrated for the sake of simplicity. The first portion 14A of the electrical redistribution layer may be configured to carry electrical signals from and/or to the first electrical contact 10A of the semiconductor chip. The second portion 14B of the electrical redistribution layer may at least partly surround the first portion 14A of the electrical redistribution layer and may be connected to the electrical contacts 10B (e.g. to the ground potential or return path). In some implementations, as shown in FIG. 3, the first portion 14A of the electrical redistribution layer may have a substantially circular shape and may be fully surrounded by the second portion 14B of the electrical redistribution layer.

The device 300 may further include an external connection element 8 having a first conductor structure 26A electrically connected to the first portion 14A of the electrical redistribution layer. The first conductor structure 26A may thus be configured to carry electrical signals from and/or to the first portion 14A of the electrical redistribution layer. In some implementations, the external connection element 8 may include a set of second conductor structures 26B which may be connected to the second portion 14B of the electrical redistribution layer (e.g., to the ground potential) and may at least partly surround the first conductor structure 26A. The conductor structures 26A and 26B are 3D-conductor structures providing a vertical electrical connection (e.g., from one layer to another layer). In some implementations, as shown in FIG. 3, the conductor structures 26A and 26B may correspond to solder balls. For example, a solder ball as used herein may have a diameter in a range from about 200 micrometer to about 300 micrometer. In some implementations, the solder ball may have a diameter in a range from about 250 micrometer to about 300 micrometer. In some implementations, the conductor structures 26A and 26B may be made of a different material and/or may be of a different shape. In general, the conductor structures 26A and 26B may include one of a solder ball, a solder pillar, a copper pillar, or a through silicon via (TSV).

In some implementations, as shown in FIG. 3, the set of second conductor structures 26B may exemplarily include four elements. More general, devices in accordance with the disclosure may include a set of second conductor structures 26B having four or less elements. In some implementations, as shown in FIG. 3, the first conductor structure 26A and the set of second conductor structures 26B may be arranged in a cross-shaped manner when viewed in a direction perpendicular to one of the main surfaces of the semiconductor chip.

In some implementations, as shown in FIG. 3, each conductor structure of the set of second conductor structures 26B may have a same distance to the first conductor structure 26A. For example, a distance between adjacent conductor structures may lie in a range between about 100 micrometer and about 600 micrometer. In some implementations, a distance between adjacent conductor structures may lie in a range between about 150 micrometer and about 550 micrometer. In some implementations, a distance between adjacent conductor structures may lie in a range between about 200 micrometer and about 500 micrometer. In some implementations the set of second conductor structures 26B are regularly distributed around the first conductor structure 26A.

The first conductor structure 26A may be configured to carry an electrical signal having a wavelength of $\lambda$, such as an RF signal. A distance between adjacent conductor structures of the set of second conductor structures 26B may then be smaller than about $\lambda/5$. In some implementations, the distance between adjacent conductor structures of the set of second conductor structures 26B may be smaller than about $\lambda/4$. In some implementations, distance between adjacent conductor structures of the set of second conductor structures 26B may be smaller than about $\lambda/3$. This way, the set of second conductor structures 26B may be configured to confine electromagnetic fields resulting from electrical signals transmitted via the first conductor structure 26A.

The first portion 14A and the second portion 14B of the electrical redistribution layer may form a coax-like electrical connection between the electrical contacts 10A, 10B of the semiconductor chip and the conductor structures 26A, 26B of the external connection element 8. Here, the coax-like electrical connection formed in the electrical redistribution layer may extend in a direction substantially parallel to the main surface of the semiconductor chip. To form a coax-like electrical connection the portions 14A and 14B of the electrical redistribution layer may be arranged in a configuration that resembles a coaxial cable configuration, whereby the grounded second portion 14B of the electrical redistribution layer is arranged in order to at least partly surround the first portion 14A of the electrical redistribution layer. In some implementations, the portion 14B completely and continuously surrounds the portion 14A. In some implementations, from a top view, the portion 14B completely and continuously surrounds the first electrical contact 10A and at least partially surrounds the electrical contacts 10B. It is to be noted that the term "coax-like" may be similarly used for all further coax-like electrical connections as described herein. In this regard, the conductor structures 26A, 26B of the external connection element 8 may form a coax-like electrical connection between the device 300 and the printed circuit board 36 in a similar fashion. This coax-like electrical connection may extend in a direction substantially vertical to one of the main surfaces of the semiconductor chip. In some implementations, the conductor structures 26B may not form a conductor continuously surrounding the conductor structure 26A. While the conductor structures 26B are not forming a continuously surrounding conductor structure, the conductor structures 26B and the conductor structure 26A are nevertheless forming a coax-like electrical connection. In some implementations, while the conductor structures 26B are not forming a continuously surrounding conductor structure, lateral projections of the conductor structures 26B onto the conductor structure 26A cover the complete or at least 90% of the surface of the conductor structure 26A.

The device 300 may be mounted on a printed circuit board 36 which may be regarded as a part of the device 300 or not. It is to be noted that printed circuit board layers 20A to 20C as shown in FIG. 1 are not illustrated in FIG. 3 for the sake of simplicity. Rather, FIG. 3 illustrates multiple electrically conductive layers 28A and 28B arranged inside of the printed circuit board 36 and forming a coplanar waveguide. In some implementations, as shown in FIG. 3, the coplanar waveguide of the printed circuit board 36 may have the form of a shielded coplanar waveguide. An example cross section of such shielded coplanar waveguide is shown and discussed in connection with FIG. 12. The coplanar waveguide may be electrically connected to the coax-like electrical connection formed by the conductor structures 26A and 26B. In this connection, a via in-land at the printed circuit board 36 may be used at the location of the signal solder ball 26A. The via in-land may be used to route the electrical signals to the internal layers of the printed circuit board 36. For example, the electrically conductive layer 28A may be configured to carry electrical signals from and/or to the first conductor structure 26A, while the electrically conductive layers 28B may be connected to the grounded second conductor structures 26B.

The printed circuit board 36 may include an electrically conductive structure 22 arranged on the upper surface of the printed circuit board 36. The electrically conductive structure 22 may include a line-shaped first portion 22A and a second portion 22B surrounding the first portion 22A. The first portion 22A may be electrically connected to layer 28A inside of the printed circuit board 36 while the second portion 22B may be connected to the grounded layers 28B. The electrically conductive structure 22 may form a coax-like electrical connection arranged on the upper surface of the printed circuit board 36. This coax-like electrical connection may be configured to electrically couple the coplanar waveguide inside of the printed circuit board 36 with one or more further elements of the device 300, such as, for example, a TX antenna and/or an RX antenna. In some implementations, as shown in FIG. 3, the further element of the device 300 is indicated by a vertical plane arranged at the end of the coax-like electrical connection 22 arranged on the upper surface of the printed circuit board 36.

As described above, the device 300 may include the following coax-like electrical connections (or coax-like transmission lines): a coax-like electrical connection formed by the portions 14A and 14B of the electrical redistribution layer, a coax-like electrical connection formed by the conductor structures 26A and 26B, a coax-like electrical connection formed by the coplanar waveguide arranged inside of the printed circuit board 36, and/or a coax-like electrical connection formed by the portions 22A and 22B of the electrically conductive structure 22 arranged on the upper surface of the printed circuit board 36. These coax-like structures may be electrically connected to each other in order to form one continuous coax-like electrical connection configured to electrically connect the semiconductor chip to further electronic components of the device 300, such as, for example, an antenna. It is understood that in further examples, one or more of the above-described coax-like electrical connections may be replaced by conventional transmission lines without a coax-like electrical structure.

Employing coax-like electrical structures as described in connection with FIG. 3 and in accordance with the disclosure may result in various technical effects described in the following.

Conventional devices may use non-coax electrical structures (or transmission lines), wherein RF transmissions from the semiconductor chip to the printed circuit board and vice versa may suffer from dispersion and high electromagnetic interference due to poor ground shielding. Low electromagnetic interference may also imply low coupling to structures used for biasing, control and thermal design on the semiconductor chip, the package, and the printed circuit board. Compared to such conventional devices, devices in accordance with the disclosure may provide high effectiveness of shielding, low RF losses, low dispersion, and reduced electromagnetic interference.

Using coax-like electrical connections as described in connection with FIG. 3 may result in low dispersion and high shield effectiveness. The techniques presented herein may reduce electromagnetic interference between channels and may increase electromagnetic susceptibility (EMS) of individual channels, for example in MIMO systems. Low electromagnetic interference may reduce inter-channel crosstalk and/or may increases RF isolation. Low electromagnetic interference may improve several figures of merits (FOM) at the system level, for example in MIMO transceivers. Maximizing the usage of such coax-like electrical structures for signal distribution may inherently provide a tighter confinement of high frequency electromagnetic fields whilst controlling local line impedance in both vertical and lateral directions. Quantitatively, crosstalk can be stated in terms of scattering parameters as $1-|S_{11}|^2-|S_{21}|^2$ which qualitatively means the energy not represented in reflection and transmission coefficients. In other words, crosstalk may represent unwanted signals coupled through dissipative paths (in dielectrics and/or conductors) and radiation. Due to the inherent confinement of electromagnetic fields by the coax-like structures in devices in accordance with the disclosure, coupling through radiation and dissipative paths may be reduced lowering crosstalk among adjacent channels, for example in MIMO transceivers (see FIG. 2). The techniques as described herein may be used on printed circuit boards with or without in-land vias.

Impedance controllability may allow structural optimization to achieve low reflection coefficients and insertion loss. Due to the confinement of electromagnetic fields in definite paths, the transmission loss and propagation delay may increase. However, it is to be noted that the coax-like mode may reduce variation of group delay (or dispersion) in some examples.

Confinement of electromagnetic fields as provided by the coax-like electrical structures in accordance with the disclosure may imply that ground planes in lateral directions on package can be cheesed without any degradation of the RF performance.

Reducing electromagnetic interference by using the coax-like electrical structures in accordance with the disclosure may be especially useful in RF products with high integration density considering trends towards mmWave frequencies which may lie beyond 30 GHz. A higher operating frequency may result in smaller die, package and printed circuit board and may reduce overall system cost. However, this may come at the cost of higher crosstalk due to tightly spaced channels. Signal distribution with the shielded coax-like electrical structures may provide these two-fold advantages, for example size/cost and reduced electromagnetic interference.

Referring back to FIG. 2, the coax-like electrical structures as described in connection with FIG. 3 and in accordance with the disclosure may be used by one or more of the illustrated TX channels and/or RX channels. By using such coax-like electrical structures, RF isolation between, in particular, adjacent channels may be increased. For example, RF isolation between channels may be increased by, for example, >40 dB for TX-TX and >50 dB for TX-RX within operational bandwidth. In comparison, with regard to TX-RX isolation and TX-TX isolation of conventional devices, at a frequency band of, for example, from about 76 GHz to about 81 GHz, an insertion loss may be in the range of about 2 dB, TX-TX isolation may be about 40 dB, and TX-TX isolation may be about 22 dB.

Simulation results based on a setup similar to FIG. 2, but including two TX channels and two RX channels showed an increased electromagnetic isolation and thus a reduced crosstalk between adjacent channels when using coax-like electrical structures in accordance with the disclosure. A TX-TX/RX-RX isolation (at the printed circuit board reference plane) showed a value of 22 dB for a device using conventional transmission lines and a value of 40 dB for a device in accordance with the disclosure using coax-like electrical structures. A TX-TX/RX-RX isolation (in a chip reference plane) showed a value of 23 dB for a device using conventional transmission lines and a value of 49 dB for a device in accordance with the disclosure using coax-like electrical structures. A TX-RX isolation (in a printed circuit board reference plane) showed a value of 37 dB for a device using conventional transmission lines and a value of 54 dB for a device in accordance with the disclosure using coax-like electrical structures. A TX-RX isolation (in a chip reference plane) showed a value of 38 dB for a device using conventional transmission lines and a value of 55 dB for a device in accordance with the disclosure using coax-like electrical structures.

An electrical transition between the coax-like electrical connections as described in connection with FIG. 3 may be free of electrical matching structures. In some implementations, no matching structure may be required between the coax-like electrical structure provided in the electrical redistribution layer and the coax-like electrical structure provided by the conductor structures 26.

Figure 4:
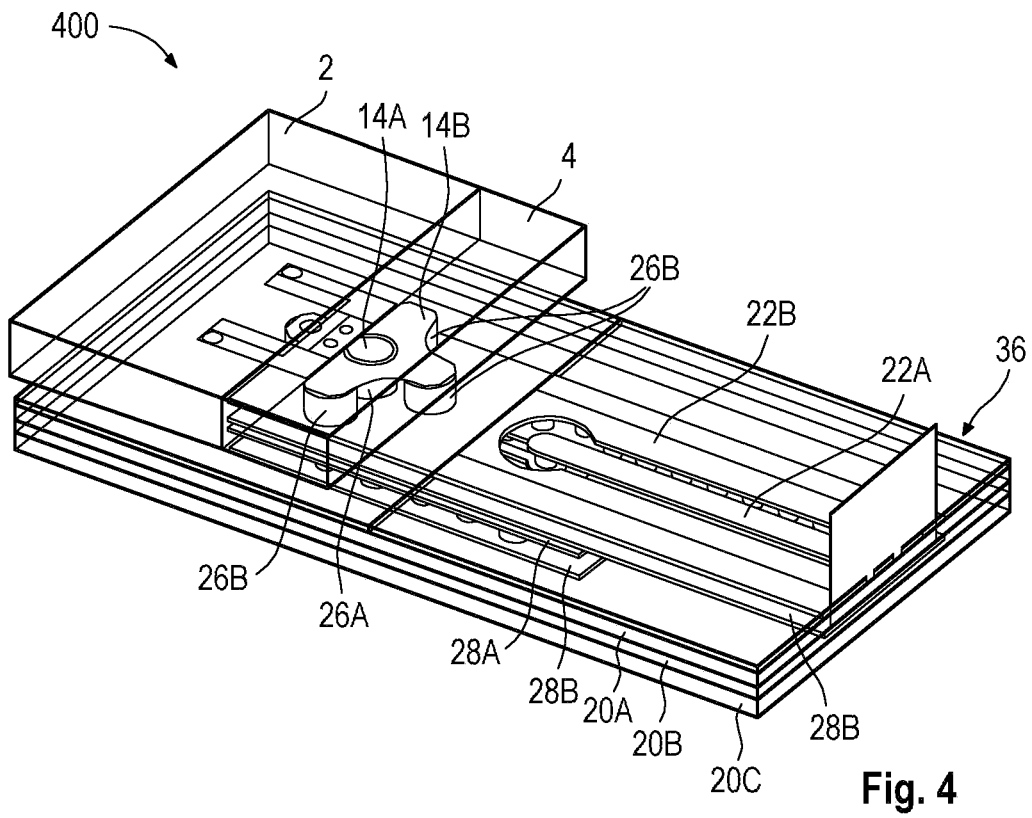
FIG. 4 schematically illustrates a perspective view of a device including a coax-like electrical connection in accordance with the disclosure.

The device 400 of FIG. 4 may include the portion of the device 300 as illustrated in FIG. 3. For illustrative purposes, FIG. 4 additionally shows a semiconductor chip 2 and an encapsulation material 4 of the device 400. Referring back to FIG. 2, the device 400 may include one or more coax-like electrical structures providing a connection between the semiconductor chip 4 and further components of the device 400. In some implementations, the signal lines for one or more TX channels and RX channels may be formed by coax-like electrical structures.

Figure 5:
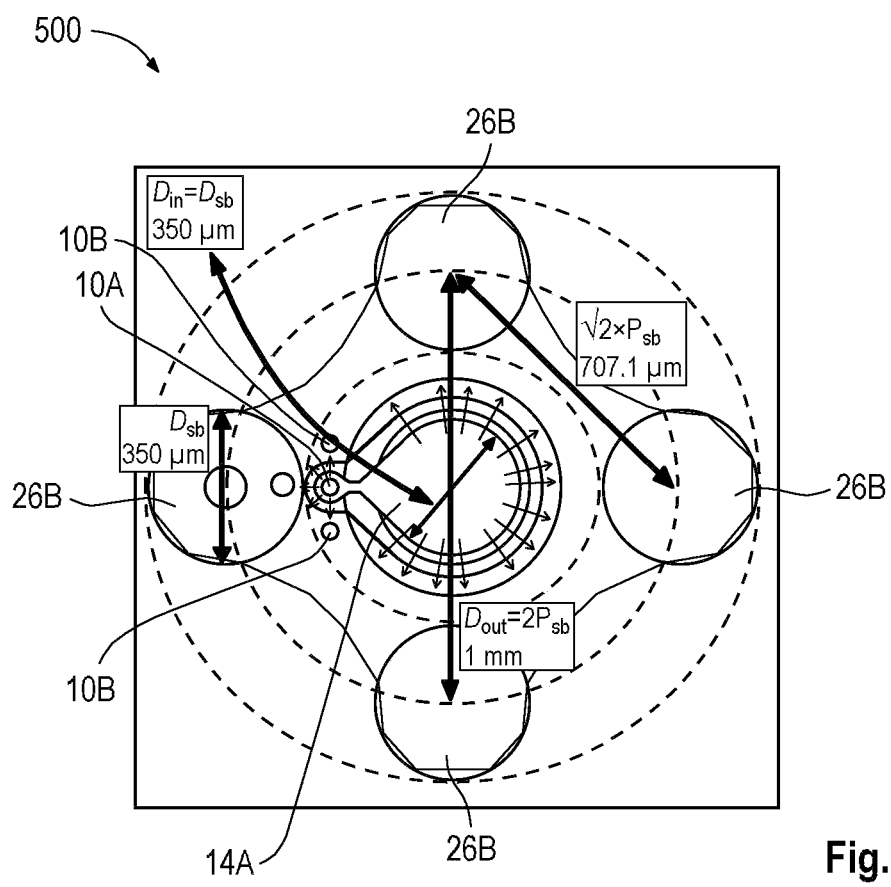
FIG. 5 schematically illustrates a top view of a portion of a device including a coax-like electrical connection in accordance with the disclosure.

FIG. 5 schematically illustrates a top view of a portion of a device 500 in accordance with the disclosure. The device 500 may include some or all of the features of one of the previously described devices, for example the device 300 of FIG. 3. For the sake of simplicity, not all components of the device 500 are shown in FIG. 5. FIG. 5 illustrates coax-like modes (e.g., electrical field patterns between signal and ground metals) at the first level interconnects and the second level interconnects with typical example geometrical values. A ball pitch of the underlying ball grid may have a value from about 200 micrometer to about 500 micrometer. In some implementations, the ball pitch of the underlying ball grid may have a value from about 250 micrometer to about 450 micrometer.

A conventional impedance calculation for a coaxial cable may be based on the equation $$Z_0 = \frac{138}{\sqrt{\epsilon_r}} \log_{10} \frac{D_{out}}{D_{in}} \quad (1)$$

wherein $D_{out}$ denotes the diameter of the outer isolator of the coaxial cable, and $D_{in}$ denotes the diameter of the inner conductor of the coaxial cable. Using equation (1) and the geometrical values given in FIG. 5, the local line impedance at the second-level interconnect (e.g., for the coax-like electrical connection provided by the conductor structures 26A and 26B) can be estimated as $$Z_0 \approx \frac{138}{\sqrt{\epsilon_r}} \log_{10} \frac{D_{out}}{D_{in}} = \quad (2)$$

$$\frac{138}{\sqrt{1}} \log_{10} \frac{2P_{sb} - 0.5D_{sb}}{D_{sb}} = 138 \log_{10} \frac{825}{350} = 51.4 \, \Omega$$

In a similar fashion, the local line impedance at the first-level interconnect (e.g. for the coax-like electrical connection provided in the electrical redistribution layer) may be estimated as $$Z_0 \approx \frac{138}{\sqrt{\epsilon_r}} \log_{10} \frac{D_{out}}{D_{in}} = \quad (3)$$

$$\frac{138}{\sqrt{3.2}} \log_{10} \frac{2P_{pil} - 0.5D_{pil}}{D_{pil}} = 77.14 \log_{10} \frac{180}{44} = 47.2 \, \Omega$$

Each of the vertical coax-like electrical connection provided by the conductor structures 26 and the lateral coax-like electrical connection provided in the electrical redistribution layer may have an electrical resistance (or line impedance) in a range from about $0.7 \cdot Z_0$ to about $1.3 \cdot Z_0$. In some implementations, each of the vertical coax-like electrical connection provided by the conductor structures 26 and the lateral coax-like electrical connection provided in the electrical redistribution layer may have an electrical resistance (or line impedance) in a range from about $0.75 \cdot Z_0$ to about $1.25 \cdot Z_0$. In some implementations, each of the vertical coax-like electrical connection provided by the conductor structures 26 and the lateral coax-like electrical connection provided in the electrical redistribution layer may have an electrical resistance (or line impedance) in a range from about $0.8 \cdot Z_0$ to about $1.2 \cdot Z_0$. In some implementations, each of the vertical coax-like electrical connection provided by the conductor structures 26 and the lateral coax-like electrical connection provided in the electrical redistribution layer may have an electrical resistance (or line impedance) in a range from about $0.9 \cdot Z_0$ to about $1.1 \cdot Z_0$. Here, $Z_0$ may be or may correspond to an RF termination impedance or a termination impedance of the underlying RF system. In this regard, an electrical termination may be regarded as the practice of ending a transmission line with a device that matches the characteristic impedance of the transmission line. Referring back to above equations (2) and (3), each of the local line impedances at the first-level and the second-level interconnects may exemplarily lie in a range from about 40Ω to about 60Ω. In some implementations, each of the local line impedances at the first-level and the second-level interconnects may exemplarily lie in a range from about 45Ω to about 55Ω.

Figure 6:
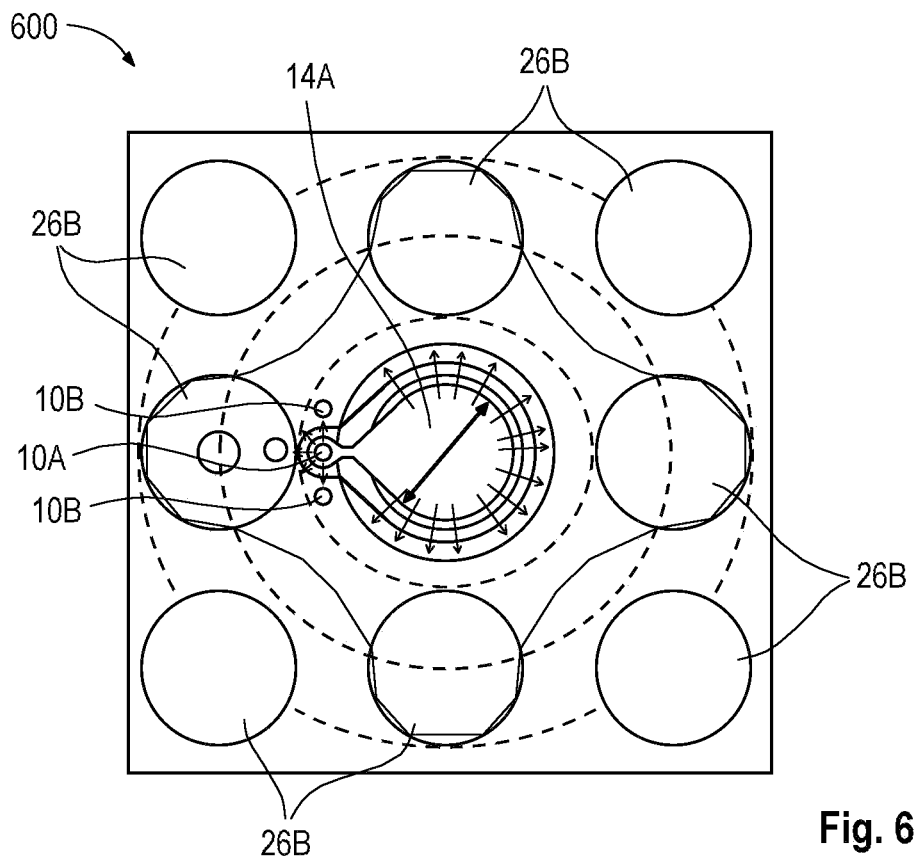
FIG. 6 schematically illustrates a top view of a portion of a device including a coax-like electrical connection in accordance with the disclosure.

FIG. 6 schematically illustrates a top view of a portion of a device 600 in accordance with the disclosure. The device 600 may include some or all of the features of devices in accordance with the disclosure as previously described, for example the device 500 of FIG. 5. In some implementations, the set of second conductor structures 26B connected to a ground potential may include additional elements. In some implementations, as shown in FIG. 6, the additional second conductor structures 26B may be arranged in the corners of the illustrated arrangement. The use of such additional second conductor structures 26B may increase the effectiveness of shielding electromagnetic fields generated by signals transmitted via the first conductor structure 26A, which may result in low RF losses, low dispersion, and reduced electromagnetic interference. In some implementations, as shown in FIG. 6, the set of second conductor structures 26B may surround the first conductor structure 26A in a substantially rectangular shape. In some implementations, the additional second conductor structures 26B may be arranged in a different fashion.

Figure 7:
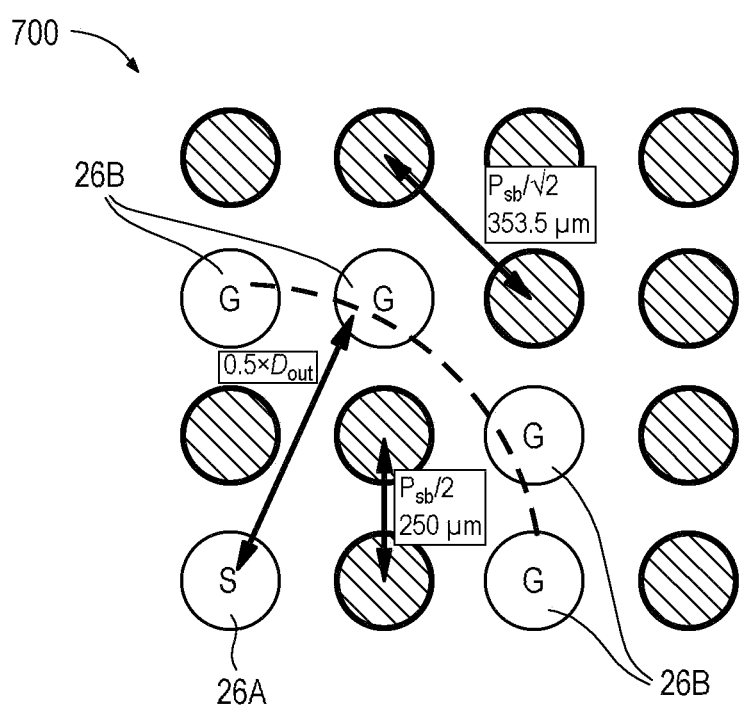
FIG. 7 schematically illustrates a top view of a portion of a device including a coax-like electrical connection in accordance with the disclosure.

FIG. 7 schematically illustrates a top view of a portion of a device 700 in accordance with the disclosure. The device 700 may include some or all of the features of devices in accordance with the disclosure as previously described. For the sake of simplicity, FIG. 7 only illustrates a top view of the coax-like electrical connection including the first conductor structure 26A and the set of second conductor structures 26B. FIG. 7 indicates typical example geometrical values of the illustrated arrangement of the conductor structures.

Compared to, for example, FIGS. 5 and 6, the conductor structures 26A and 26B of FIG. 7 may be arranged (based) on a half-sized (ball) pitch of the underlying ball grid array (BGA) while maintaining the values of $D_{in}$, $D_{out}$, and therefore the value of the local line impedance. In FIG. 7, the hatched circles indicate de-populated positions of the underlying regular rectangular ball grid array pattern or grid. Note that the de-populated positions are not occupied by elements of the set of second conductor structures 26B. In some implementations, as shown in FIG. 7, the set of second conductor structures 26B may surround the first conductor structure 26A in a regular polygon shape. In some implementations, such polygon shape may result in a substantially circular coax-like electrical pattern. By reducing the ball pitch (and/or providing a denser ball grid) and increasing the number of second conductor structures 26B, the effectiveness of shielding electromagnetic fields generated by signal conductor structure 26A may be increased, which may result in low RF losses, low dispersion, and reduced electromagnetic interference.

Figure 8:
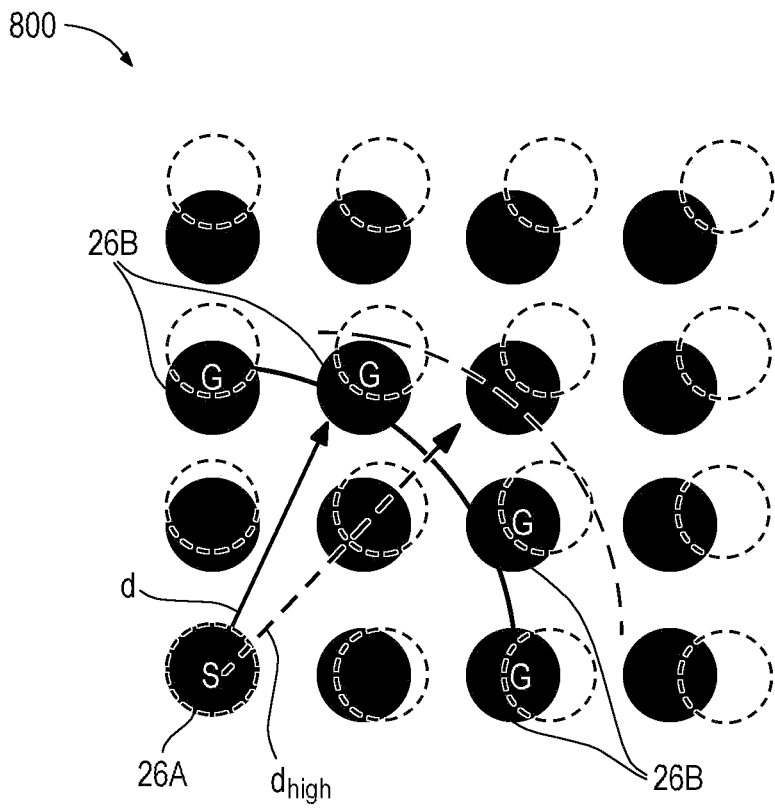
FIG. 8 schematically illustrates a top view of an expansion of a portion of a device including a coax-like electrical connection in accordance with the disclosure at a high temperature.
Figure 9:
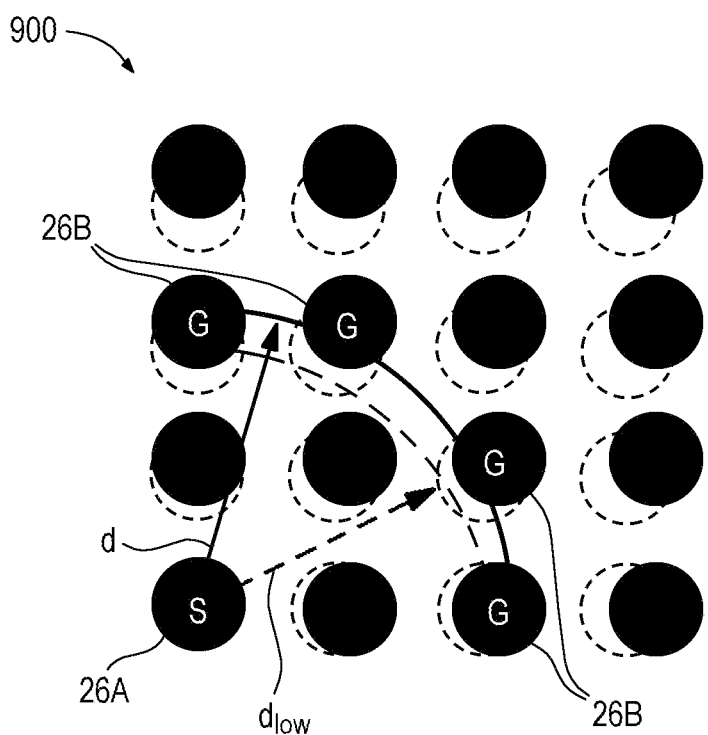
FIG. 9 schematically illustrates a top view of a contraction of a portion of a device including a coax-like electrical connection in accordance with the disclosure at a low temperature.

The devices 800 and 900 of FIGS. 8 and 9 may include some or all of the features of previously described devices in accordance with the disclosure, respectively. Each of the devices 800 and 900 may include conductor structures 26A and 26B arranged in a coax-like arrangement as, for example, described in connection with FIG. 7. FIG. 8 indicates expanded positions of the underlying ball grid array at a high temperature which may, for example, occur during a conventional temperature change or during a thermal cycling process. In this connection, a distance d between the first conductor structure 26A and elements of the set of second conductor structures 26B may be increased to a value of $d_{high}$. Despite the described expansion of the grid positions, a variation of impedance may be limited within a tolerable range. In some implementations, an increased spill-out of electromagnetic fields may still be avoided due to the confinement provided by the second conductor structures 26B. FIG. 9 indicates a contraction of the positions of the underlying ball grid array at a low temperature. In this connection, a distance d between the first conductor structure 26A and elements of the set of second conductor structures 26B may be decreased to a value of $d_{low}$.

Figure 10:
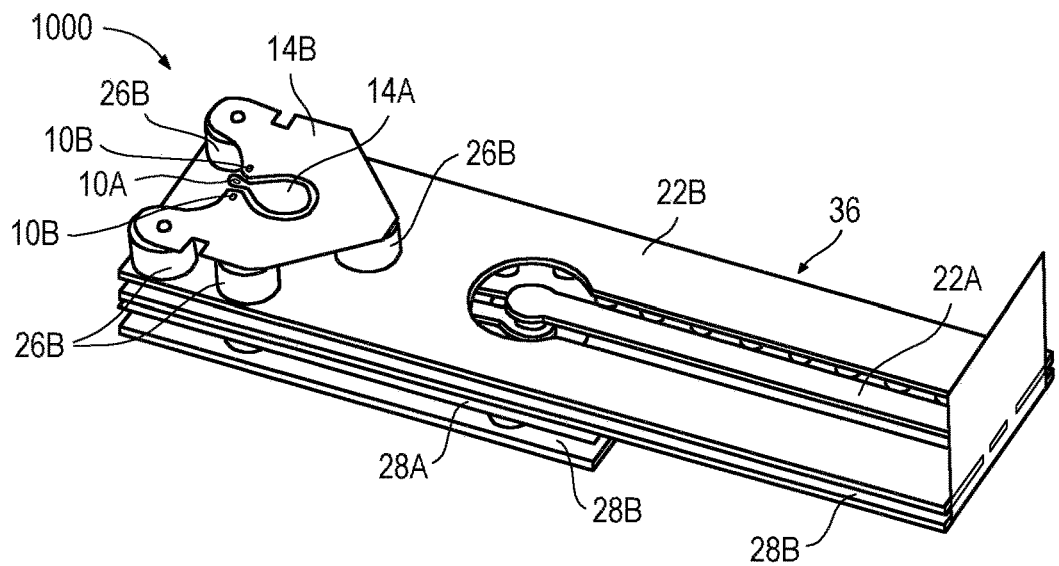
FIG. 10 schematically illustrates a perspective view of a portion of a device including a coax-like electrical connection in accordance with the disclosure.

FIG. 10 schematically illustrates a perspective view of a portion of a device 1000 in accordance with the disclosure. For example, the device 1000 may include some or all of the features of the device 300 of FIG. 3. In some implementations, the elements of the set of second conductor structures 26B may be arranged in a V-shaped manner. Note that, due to the chosen perspective, the first conductor structure 26A of the device 1000 may be hidden behind the portions 14A and 14B of the electrical redistribution layer in FIG. 10. The geometrical shape of the portions 14A and 14B of the electrical redistribution layer may be adapted to the configuration of the conductor structures 26 accordingly. That is, the shape of the second portion 14B of the electrical redistribution layer also may be substantially V-shaped, thereby surrounding the first portion 14A of the electrical redistribution layer.

Compared to the cross-shaped configuration of the conductor structures 26A and 26B of FIG. 3, the element of the grounded second conductor structures 26B arranged behind the first conductor structure 26A carrying the electrical signals may have been removed or may be missing. This may be because such additional grounded conductor structure and associated sections of the electrical redistribution layer electrically connected thereto may require some adaptation of RF circuits placed about these grounded structures. In FIG. 10, this back ground shielding may be removed, resulting in the V-shaped form of the set of second conductor structures 26B. In this connection, it is to be noted that a degradation of electromagnetic interference due to the missing ground solder ball may be not necessarily significant in the transmit channels.

Figure 11:
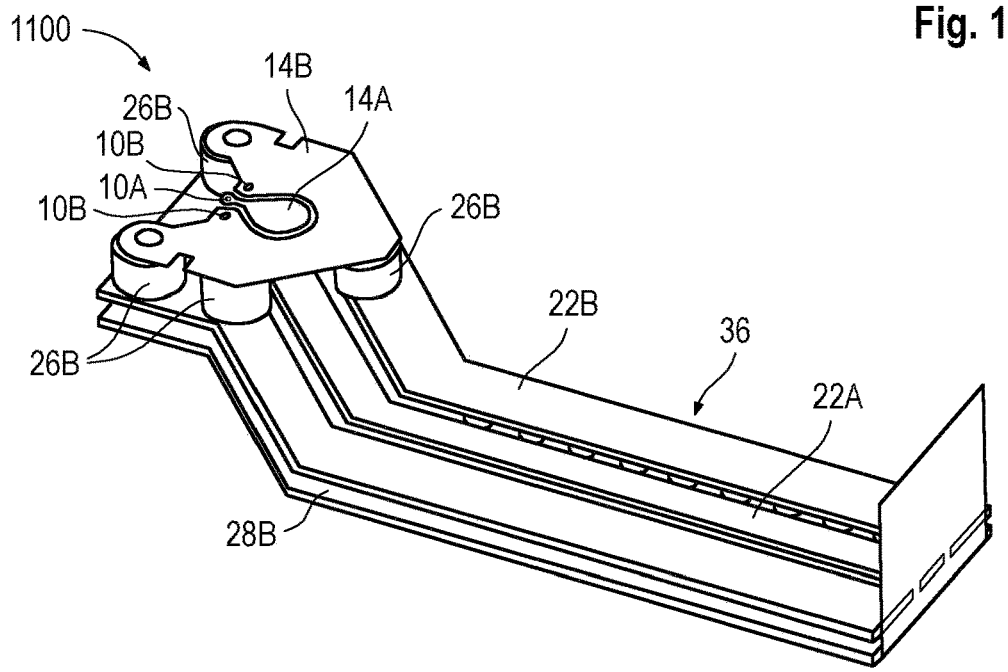
FIG. 11 schematically illustrates a perspective view of a portion of a device including a coax-like electrical connection in accordance with the disclosure.

FIG. 11 schematically illustrates a perspective view of a portion of a device 1100 in accordance with the disclosure. For example, the device 1100 may include some or all of the features of the devices 300 and 1000 of FIGS. 3 and 10, respectively. In some implementations, the configuration of the first conductor structures 26A and the second conductor structures 26B in FIG. 11 may be similar to FIG. 10. In some implementations, the printed circuit board 36 of the device 1100 may not include an internal coplanar waveguide. In some implementations, the printed circuit board 36 may include a coax-like electrical connection 22A, 22B arranged on the upper surface of the printed circuit board 36, wherein the coax-like electrical connection 22A, 22B may be bent by an angle of greater than about 20°. In some implementations, the coax-like electrical connection 22A, 22B may be bent by an angle of greater than about 25°. In some implementations, the coax-like electrical connection 22A, 22B may be bent by an angle of greater than about 30°. In some implementations, the coax-like electrical connection 22A, 22B may be bent by an angle of greater than about 35°. In some implementations, the coax-like electrical connection 22A, 22B may be bent by an angle of greater than about 40°. A specific example value of the angle may be about 45°. Avoiding usage of a shielded coplanar waveguide inside of the printed circuit board 36 may result in a simplification of the printed circuit board 36 and may thus be more acceptable to customers. In this regard, it may be possible to avoid via in-land. The coax-like electrical connection on the upper surface of the printed circuit board 36 may be electrically connected to a coax-like electrical connection formed by the first conductor structures 26A and the second conductor structures 26B.

Figure 12:
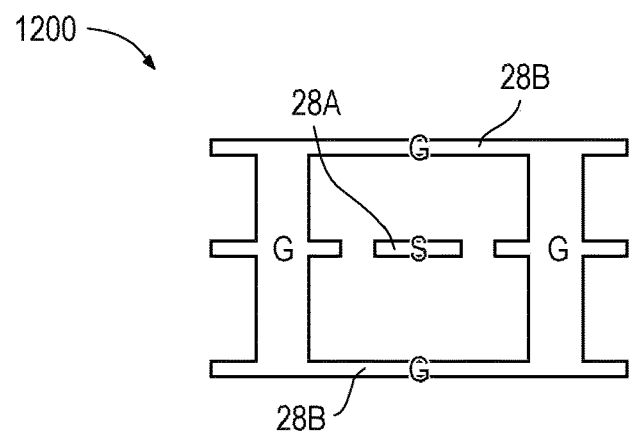
FIG. 12 schematically illustrates a cross-sectional side view of a shielded coplanar waveguide in accordance with the disclosure.

FIG. 12 illustrates a cross sectional side view of a shielded coplanar waveguide 1200. For example, the shielded coplanar waveguide 1200 may be used in the device 300 of FIG. 3. The shielded coplanar waveguide 1200 may include a signal line (see "S") formed by an electrically conductive layer 28A and configured to carry electrical signals. The signal line may be surrounded by ground planes (see "G") which may be formed by electrically conductive layers 28B. In some implementations, as shown in FIG. 12, the signal line may be fully surrounded by the ground planes, wherein a coax-like electrical connection may be formed. In some implementations, the shielded coplanar waveguide 1200 of FIG. 12 may form or may correspond to a variant of a grounded coplanar waveguide transmission line.

Figure 13:
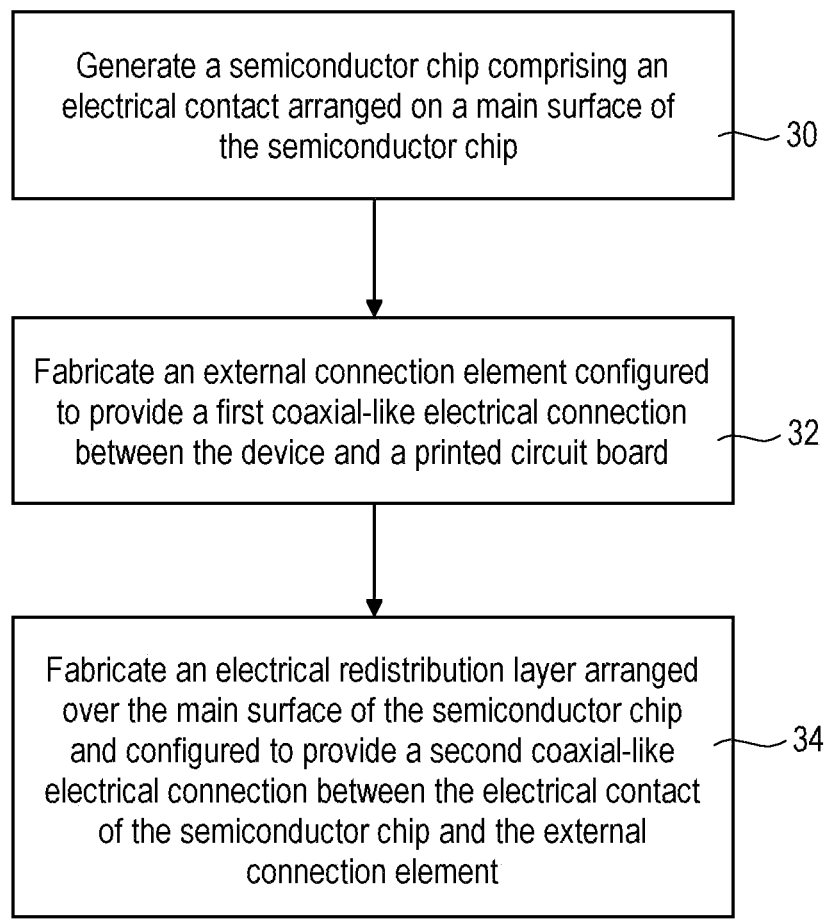
FIG. 13 illustrates a flowchart of a method for manufacturing a device including a coax-like electrical connection in accordance with the disclosure.

FIG. 13 illustrates a flowchart of a method for manufacturing a device in accordance with the disclosure. The method is described in a general manner in order to qualitatively specify aspects of the disclosure. It is understood that the method of FIG. 13 may include further aspects. For example, the method of FIG. 13 may be extended by any of the aspects described in connection with other examples in accordance with the disclosure. The method of FIG. 13 may be used for manufacturing a device in accordance with the disclosure. Accordingly, the method may be read in connection with devices in accordance with the disclosure as previously described.

At 30, a semiconductor chip including an electrical contact arranged on a main surface of the semiconductor chip may be generated. At 32, an external connection element configured to provide a first coax-like electrical connection between the device and a printed circuit board may be fabricated. The first coax-like electrical connection may include a section extending in a direction vertical to the main surface of the semiconductor chip. At 34, an electrical redistribution layer may be fabricated. The electrical redistribution layer may be arranged over the main surface of the semiconductor chip and may be configured to provide a second coax-like electrical connection between the electrical contact of the semiconductor chip and the external connection element. The second coax-like electrical connection may include a section extending in a direction parallel to the main surface of the semiconductor chip.

Aspects

In the following, devices and methods for manufacturing devices will be explained using aspects.

Aspect 1 is a device, comprising: a semiconductor chip comprising an electrical contact arranged on a main surface of the semiconductor chip; an external connection element configured to provide a first coax-like electrical connection between the device and a printed circuit board, wherein the first coax-like electrical connection comprises a section extending in a direction vertical to the main surface of the semiconductor chip; and an electrical redistribution layer arranged over the main surface of the semiconductor chip and configured to provide a second coax-like electrical connection between the electrical contact of the semiconductor chip and the external connection element, wherein the second coax-like electrical connection comprises a section extending in a direction parallel to the main surface of the semiconductor chip.

Aspect 2 is a device according to Aspect 1, wherein the external connection element is configured to provide a mechanical connection between the device and the printed circuit board.

Aspect 3 is a device according to Aspects 1 or 2, further comprising: an encapsulation material, wherein the semiconductor chip is at least partly embedded in the encapsulation material, wherein the main surface of the semiconductor chip and a main surface of the encapsulation material are arranged in a common plane, wherein the electrical redistribution layer is at least partly extending over the main surface of the encapsulation material, and wherein the external connection element is arranged lateral to the semiconductor chip.

Aspect 4 is a device according to one of the preceding Aspects, wherein the device comprises an embedded wafer level ball grid array package.

Aspect 5 is a device according to one of the preceding Aspects, wherein the first coax-like electrical connection comprises: a first conductor structure configured to carry an electrical signal; and a set of second conductor structures at least partly surrounding the first conductor structure and connected to a ground potential or return path.

Aspect 6 is a device according to Aspect 5, wherein each conductor structure of the set of second conductor structures has a same distance to the first conductor structure.

Aspect 7 is a device according to Aspects 5 or 6, wherein the set of second conductor structures has four or less elements.

Aspect 8 is a device according to one of Aspects 5 through 7, wherein at least one of the first conductor structure and the second conductor structures comprises one of a solder ball, a solder pillar, or a through silicon via.

Aspect 9 is a device according to one of Aspects 5 through 8, wherein the first conductor structure and the set of second conductor structures are arranged in a cross-shaped manner.

Aspect 10 is a device according to one of Aspects 5 through 8, wherein the set of second conductor structures is arranged in a V-shaped manner.

Aspect 11 is a device according to one of Aspects 5 through 8, wherein the set of second conductor structures surrounds the first conductor structure in a rectangular shape.

Aspect 12 is a device according to one of Aspects 5 through 8, wherein the set of second conductor structures surrounds the first conductor structure in a regular polygon shape.

Aspect 13 is a device according to one of Aspects 5 through 12, wherein: the first conductor structure is configured to carry an electrical signal having a wavelength of k, and a distance between adjacent conductor structures of the set of second conductor structures is smaller than $\lambda/5$.

Aspect 14 is a device according to one of Aspects 5 through 13, wherein a distance between adjacent conductor structures is between 100 micrometer and 600 micrometer.

Aspect 15 is a device according to one of the preceding Aspects, wherein the second coax-like electrical connection comprises: a first portion of the electrical redistribution layer configured to carry an electrical signal from and/or to the electrical contact of the semiconductor chip; and a second portion of the electrical redistribution layer at least partly surrounding the first portion of the electrical redistribution layer and connected to a ground potential.

Aspect 16 is a device according to Aspect 15, wherein: the first conductor structure is electrically connected to the first portion of the electrical redistribution layer, and the set of second conductor structures is electrically connected to the second portion of the electrical redistribution layer.

Aspect 17 is a device according to one of the preceding Aspects, wherein the printed circuit board comprises a coplanar waveguide arranged inside of the printed circuit board and electrically connected to the first coax-like electrical connection.

Aspect 18 is a device according to Aspect 17, wherein: the printed circuit board comprises a third coax-like electrical connection arranged on a surface of the printed circuit board, and the third coax-like electrical connection is configured to electrically couple the coplanar waveguide and a further element.

Aspect 19 is a device according to one of Aspects 1 through 16, wherein: the printed circuit board comprises a third coax-like electrical connection arranged on a surface of the printed circuit board, wherein the third coax-like electrical connection is bent by an angle of greater than 20°, and the third coax-like electrical connection is configured to electrically couple the first coax-like electrical connection and a further element.

Aspect 20 is a device according to one of the preceding Aspects, wherein each of the first coax-like electrical connection and the second coax-like electrical connection has an electrical resistance in a range from $0.7 \cdot Z_0$ to $1.3\ Z_0$, wherein $Z_0$ is an RF system termination impedance.

Aspect 21 is a device according to one of the preceding Aspects, wherein an electrical transition between the first coax-like electrical connection and the second coax-like electrical connection is free of electrical matching structures.

Aspect 22 is a method for manufacturing a device, wherein the method comprises: generating a semiconductor chip comprising an electrical contact arranged on a main surface of the semiconductor chip; fabricating an external connection element configured to provide a first coax-like electrical connection between the device and a printed circuit board, wherein the first coax-like electrical connection comprises a section extending in a direction vertical to the main surface of the semiconductor chip; and fabricating an electrical redistribution layer arranged over the main surface of the semiconductor chip and configured to provide a second coax-like electrical connection between the electrical contact of the semiconductor chip and the external connection element, wherein the second coax-like electrical connection comprises a section extending in a direction parallel to the main surface of the semiconductor chip.

As employed in this specification, the terms "connected", "coupled", "electrically connected", and/or "electrically coupled" may not necessarily mean that elements must be directly connected or coupled together. Intervening elements may be provided between the "connected", "coupled", "electrically connected", or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or multiple additional layers being arranged between the implied surface and the material layer.

Furthermore, to the extent that the terms "having", "containing", "including", "with", or variants thereof are used in either the detailed description or the claims, such terms are intended to be inclusive in a manner similar to the term "comprising". That is, as used herein, the terms "having", "containing", "including", "with", "comprising", and the like are open-ended terms that indicate the presence of stated elements or features, but do not preclude additional elements or features. The articles "a", "an", and "the" are intended to include the plural as well as the singular, unless the context clearly indicates otherwise.

Moreover, the word "example" is used herein to mean serving as an example, instance, or illustration. Any aspect or design described herein as "example" is not necessarily to be construed as advantageous over other aspects or designs. Rather, use of the word example is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although the disclosure has been shown and described with respect to one or multiple implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or multiple other features of the other implementations as may be desired and advantageous for any given or particular application.

What is claimed is:

1. A device, comprising:
   a semiconductor chip comprising an electrical contact arranged on a main surface of the semiconductor chip;
   an external connection element configured to provide a first coax-like electrical connection between the device and a printed circuit board, wherein the first coax-like electrical connection comprises a section extending in a direction vertical to the main surface of the semiconductor chip, and wherein the printed circuit board comprises a coplanar waveguide electrically connected to the first coax-like electrical connection; and
   an electrical redistribution layer arranged over the main surface of the semiconductor chip and configured to provide a second coax-like electrical connection between the electrical contact of the semiconductor chip and the external connection element, wherein the second coax-like electrical connection comprises a section extending in a direction parallel to the main surface of the semiconductor chip.

2. The device of claim 1, wherein the external connection element is configured to provide a mechanical connection between the device and the printed circuit board.

3. The device of claim 1, further comprising:
   an encapsulation material, wherein the semiconductor chip is at least partly embedded in the encapsulation material, wherein the main surface of the semiconductor chip and a main surface of the encapsulation material are arranged in a common plane, wherein the electrical redistribution layer is at least partly extending over the main surface of the encapsulation material, and wherein the external connection element is arranged lateral to the semiconductor chip.

4. The device of claim 1, wherein the device comprises an embedded wafer level ball grid array package.

5. The device of claim 1, wherein the first coax-like electrical connection comprises:
   a first conductor structure configured to carry an electrical signal; and
   a set of second conductor structures at least partly surrounding the first conductor structure and connected to a ground potential or a return path.

6. The device of claim 5, wherein each conductor structure of the set of second conductor structures has a same distance to the first conductor structure.

7. The device of claim 5, wherein the set of second conductor structures has four or less elements.

8. The device of claim 5, wherein at least one of the first conductor structure and the second conductor structures comprises one of a solder ball, a solder pillar, or a through silicon via.

9. The device of claim 5, wherein the first conductor structure and the set of second conductor structures are arranged in a cross-shaped manner.

10. The device of claim 5, wherein the set of second conductor structures is arranged in a V-shaped manner.

11. The device of claim 5, wherein the set of second conductor structures surrounds the first conductor structure in a rectangular shape.

12. The device of claim 5, wherein the set of second conductor structures surrounds the first conductor structure in a regular polygon shape.

13. The device of claim 5, wherein:
   the first conductor structure is configured to carry an electrical signal having a wavelength of $\lambda$, and
   a distance between adjacent conductor structures of the set of second conductor structures is smaller than $\lambda/5$.

14. The device of claim 5, wherein a distance between adjacent conductor structures, of the set of second conductor structures, is between 100 micrometer and 600 micrometer.

15. The device of claim 5, wherein the second coax-like electrical connection comprises:
   a first portion of the electrical redistribution layer configured to carry an electrical signal from or to the electrical contact of the semiconductor chip; and
   a second portion of the electrical redistribution layer at least partly surrounding the first portion of the electrical redistribution layer and connected to a ground potential.

16. The device of claim 15, wherein:
   the first conductor structure is electrically connected to the first portion of the electrical redistribution layer, and
   the set of second conductor structures is electrically connected to the second portion of the electrical redistribution layer.

17. The device of claim 1, wherein:
   the printed circuit board comprises a third coax-like electrical connection arranged on a surface of the printed circuit board, and
   the third coax-like electrical connection is configured to electrically couple the coplanar waveguide and a further element.

18. The device of claim 1, wherein:
   the printed circuit board comprises a third coax-like electrical connection arranged on a surface of the printed circuit board, wherein the third coax-like electrical connection is bent by an angle of greater than 20°, and
   the third coax-like electrical connection is configured to electrically couple the first coax-like electrical connection and another element.

19. The device of claim 1, wherein each of the first coax-like electrical connection and the second coax-like electrical connection has an electrical resistance in a range from $0.7 \cdot Z_0$ to $1.3 \cdot Z_0$, wherein $Z_0$ is a radio frequency (RF) system termination impedance.

20. The device of claim 1, wherein an electrical transition between the first coax-like electrical connection and the second coax-like electrical connection is free of electrical matching structures.

21. A method for manufacturing a device, wherein the method comprises:
   generating a semiconductor chip comprising an electrical contact arranged on a main surface of the semiconductor chip;
   fabricating an external connection element configured to provide a first coax-like electrical connection between the device and a printed circuit board, wherein the first coax-like electrical connection comprises a section extending in a direction vertical to the main surface of the semiconductor chip; and
   fabricating an electrical redistribution layer arranged over the main surface of the semiconductor chip and configured to provide a second coax-like electrical connection between the electrical contact of the semiconductor chip and the external connection element, wherein the second coax-like electrical connection comprises a section extending in a direction parallel to the main surface of the semiconductor chip.

22. The method of claim 21, wherein the external connection element is configured to provide a mechanical connection between the device and the printed circuit board.

* * * * *